(12) United States Patent
An et al.

(10) Patent No.: US 8,773,865 B2
(45) Date of Patent: Jul. 8, 2014

(54) ELECTRONIC CIRCUIT MODULE AND METHOD OF MAKING THE SAME

(75) Inventors: Jin-Hong An, Yongin-si (KR); Jae-Soon Kim, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 27 days.

(21) Appl. No.: 13/592,151

(22) Filed: Aug. 22, 2012

(65) Prior Publication Data

US 2012/0313656 A1     Dec. 13, 2012

Related U.S. Application Data

(63) Continuation of application No. 12/848,000, filed on Jul. 30, 2010, now Pat. No. 8,264,847.

(30) Foreign Application Priority Data

Oct. 26, 2009   (KR) .................. 10-2009-0101723

(51) Int. Cl.
*H05K 7/02*       (2006.01)
*H05K 3/28*       (2006.01)

(52) U.S. Cl.
USPC ............. 361/760; 361/737; 361/793; 438/15; 438/18

(58) Field of Classification Search
USPC ................ 361/732, 736, 748, 752, 760–767, 361/782–784, 791; 174/250–267; 257/48, 257/E21.525, 666, 777, 778, 786, 690, 257/E21.526, E23.172; 324/537, 750.3, 324/750.05, 756.02, 762.03, 754.1, 763.01, 324/754.08; 439/76.1; 438/6–18; 29/825–852
See application file for complete search history.

(56) References Cited

U.S. PATENT DOCUMENTS 3,835,530 A      9/1974 Kilby
4,701,781 A  * 10/1987 Sankhagowit ............... 257/671

(Continued)

FOREIGN PATENT DOCUMENTS

JP      6-169033 A     6/1994
JP   2002-016369 A     1/2002

(Continued)

OTHER PUBLICATIONS

Korean Office Action dated Mar. 30, 2011 for Korean Patent Application No. KR 10-2009-0101723 which corresponds to captioned U.S. Appl. No. 12/848,000.

(Continued)

*Primary Examiner* — Michail V Datskovskiy
(74) *Attorney, Agent, or Firm* — Knobbe, Martens Olson & Bear, LLP

(57) ABSTRACT

An electronic circuit module and a method of manufacturing the electronic circuit module are disclosed. In one embodiment, the electronic circuit module includes i) a substrate on which a circuit is formed, ii) a plurality of electrical devices electrically connected to the circuit and iii) a first molding unit coated on the substrate to cover at least the electrical devices. The module further includes i) a test terminal unit comprising a plurality of test wires and configured to inspect the circuit, wherein each of the test wires comprises a first end electrically connected to the circuit and a second end exposed from the first molding unit, and wherein the second ends of the test wires form an inspection unit and are adjacent to each other on the substrate and ii) a second molding unit coated on the substrate to cover the second ends of the test wires.

20 Claims, 6 Drawing Sheets

(56) References Cited

U.S. PATENT DOCUMENTS

| | | |
|---|---|---|
| 4,937,203 A | 6/1990 | Eichelberger et al. |
| 5,773,880 A | 6/1998 | Ohno |
| 5,789,930 A | 8/1998 | Isaacs et al. |
| 5,963,045 A | 10/1999 | Zink et al. |
| 6,251,695 B1 | 6/2001 | Kwon |
| 6,519,728 B2 | 2/2003 | Tsujii et al. |
| 6,621,260 B2 | 9/2003 | Eldridge et al. |
| 6,867,485 B2 | 3/2005 | Wallace |
| 7,124,341 B2 | 10/2006 | Antley et al. |
| 7,132,841 B1 | 11/2006 | Bertin et al. |
| 7,198,965 B2 | 4/2007 | He |
| 7,293,716 B1* | 11/2007 | Miks ............................ 235/492 |
| 7,307,848 B2 | 12/2007 | Takiar |
| 7,352,199 B2 | 4/2008 | Chhor et al. |
| 7,416,132 B2* | 8/2008 | Takiar et al. .................. 235/492 |
| 7,552,876 B2 | 6/2009 | Nishizawa et al. |
| 7,709,278 B2 | 5/2010 | McCarthy et al. |
| 7,778,057 B2 | 8/2010 | McCarthy et al. |
| 7,864,540 B2 | 1/2011 | Takiar |
| 7,901,957 B2 | 3/2011 | Frenklakh |
| 7,915,720 B2 | 3/2011 | Tashiro et al. |
| 7,928,010 B2* | 4/2011 | Middlekauff et al. ........ 438/674 |
| 8,013,332 B2* | 9/2011 | Middlekauff et al. .......... 257/48 |
| 8,077,478 B2 | 12/2011 | Takatori et al. |
| 2002/0153538 A1* | 10/2002 | Kawai ............................ 257/203 |
| 2005/0274982 A1* | 12/2005 | Ueda et al. ..................... 257/202 |
| 2008/0017408 A1* | 1/2008 | Morishita et al. ............. 174/260 |
| 2008/0290488 A1* | 11/2008 | Masuda et al. ................. 257/679 |
| 2009/0127716 A1 | 5/2009 | Takatsuki |
| 2009/0152544 A1* | 6/2009 | Frenklakh ........................ 257/48 |
| 2009/0153163 A1 | 6/2009 | Han et al. |
| 2011/0096518 A1 | 4/2011 | An et al. |

FOREIGN PATENT DOCUMENTS

| | | |
|---|---|---|
| JP | 2003-188340 A | 7/2003 |
| JP | 2007-110008 A | 4/2007 |
| JP | 2008-181989 A | 8/2008 |
| KR | 10-2008-0076092 A | 8/2008 |
| KR | 10-0878409 B1 | 1/2009 |
| KR | 10-2009-022481 A | 3/2009 |

OTHER PUBLICATIONS

Korean Registration Determination Certificate dated Nov. 26, 2011 for Korean Patent Application No. KR 10-2009-0101723 which corresponds to captioned U.S. Appl. No. 12/848,000.

* cited by examiner

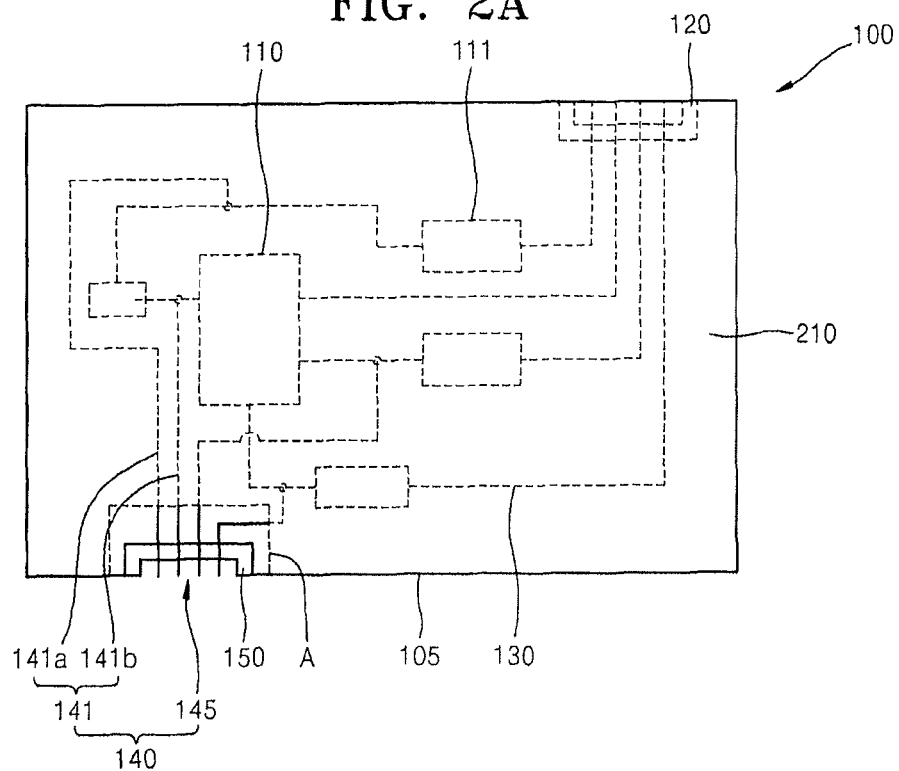
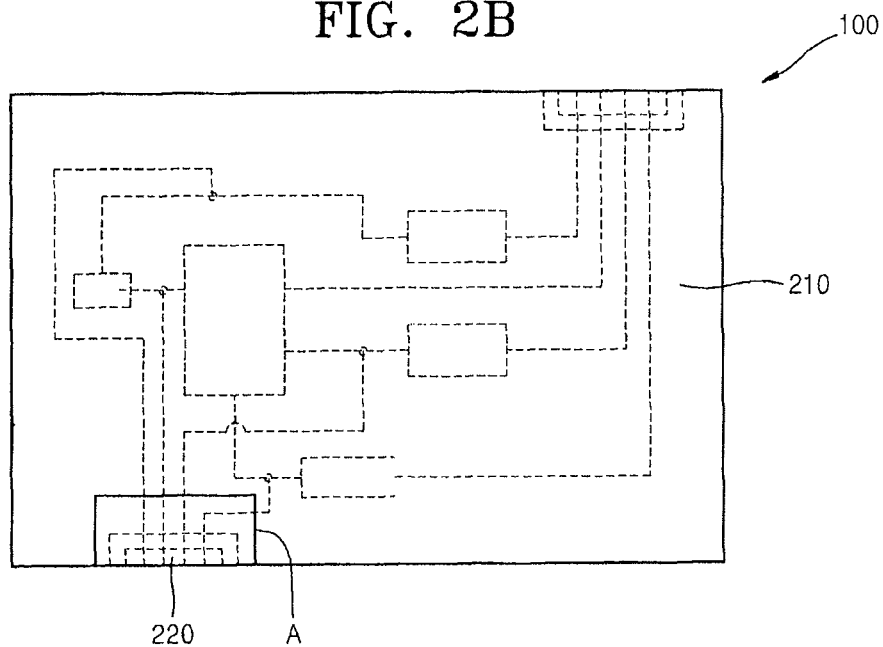

ELECTRONIC CIRCUIT MODULE AND METHOD OF MAKING THE SAME

RELATED APPLICATIONS

This application is a continuation application which claims priority under 35 U.S.C. §120 from application Ser. No. 12/848,000 filed Jul. 30, 2010, which is hereby incorporated by reference. Application Ser. No. 12/848,000 claimed the benefit of Korean Patent Application No. 10-2009-0101723, filed on Oct. 26, 2009, in the Korean Intellectual Property Office, the disclosure of which is incorporated herein in its entirety by reference.

BACKGROUND

1. Field

At least one of disclosed embodiments relates to an electronic circuit module and a method of making the same, and more particularly, to an electronic circuit module having a circuit inspecting function and a method of making the same.

2. Description of the Related Technology

Generally, printed circuit boards (PCBs) are manufactured by forming a copper film on the surface of a panel formed of an insulator, such as resin, and performing operations, such as pattern printing and etching, which are based on a circuit design, on the copper film to form a wiring figure. Such PCBs are being used as electric and electronic components of home appliances, industrial apparatuses, aerospace apparatuses, etc. In particular, PCBs being used in high-performance electric or electronic products (for example, portable phones) need to be manufactured more accurately. In addition, circuit components such as high-density and highly-integrated VLSI circuits need to be more accurately manufactured as well. Here, VLSI stands for very large scale integration.

SUMMARY OF CERTAIN INVENTIVE ASPECTS

One aspect of the present invention is an electronic circuit module, which includes a substrate on which a circuit is formed; a plurality of electric devices electrically connected to the circuit; a first molding unit coated on the substrate to cover at least the plurality of electric devices; a test terminal unit including a plurality of test wires for inspecting the circuit, wherein each of the plurality of test wires includes a first end electrically connected to the circuit and a second end exposed from the first molding unit; and a second molding unit coated on the substrate to cover the second ends of the plurality of test wires, wherein an inspection unit where the second ends of the plurality of the test wires are gathered adjacent to each other on the substrate is included.

The second molding unit may have a lower melting point than the first molding unit. The first molding unit may have a higher thermal conductivity than the second molding unit. The first molding unit may be nonflammable. The second molding unit and the first molding unit may have different reactivities. The plurality of electric devices may be gathered and disposed on the substrate so that the single first molding unit may cover all of the plurality of electric devices. The single second molding unit is coated on the substrate to cover the inspection unit. The first molding unit and the second molding unit may have different surface colors. A mark may be put on an area of the second molding unit corresponding to the second ends of the test wires.

The inspection unit of the test terminal unit may be disposed on an edge of the substrate. The inspection unit of the test terminal unit may further include an inspection unit connector so as to be electrically connected to the outside. The inspection unit of the test terminal unit may be disposed on an area of the substrate that is opposite to an area of the substrate on which a current input/output unit of the electronic circuit module is disposed.

The electronic circuit module may be electrically connected to a secondary battery that includes an anode, a cathode, and a separator, so as to protect the secondary battery. The secondary battery may be applied to electric bicycles. The secondary battery may be applied to electric driving apparatuses. The electronic circuit module may be applied to battery management systems (BMSs). The electronic circuit module may also be applied to battery packs.

Another aspect of the present invention is a method of manufacturing an electronic circuit module, which includes the operations of forming a circuit including a plurality of electric devices on a substrate; forming on the substrate a test terminal unit including a plurality of test wires, each of the plurality of test wires including a first end electrically connected to the circuit to inspect the circuit; coating a first molding unit on the substrate so as not to cover respective second ends of the plurality of test wires; and coating a second molding unit on the substrate to cover the second ends of the plurality of test wires, wherein the second ends of the plurality of the test wires are gathered adjacent to each other on the substrate.

The second molding unit may have a lower melting point than the first molding unit. The first molding unit may be formed to have a higher thermal conductivity than the second molding unit. The method further include the operation of checking normality or abnormality of the circuit by electrically testing the second ends of the plurality of the test wires, after the operation of coating the first molding unit on the substrate. The method further include the operation of removing at least a portion of the second molding unit to expose the second ends of the plurality of test wires and then inspecting the circuit.

Another aspect is an electronic circuit module comprising: a substrate on which a circuit is formed; a plurality of electrical devices electrically connected to the circuit; a first molding unit coated on the substrate to cover at least the electrical devices; a test terminal unit comprising a plurality of test wires and configured to inspect the circuit, wherein each of the test wires comprises a first end electrically connected to the circuit and a second end exposed from the first molding unit, and wherein the second ends of the test wires form an inspection unit and are adjacent to each other on the substrate; and a second molding unit coated on the substrate to cover the second ends of the test wires.

In the above module, the second molding unit has a lower melting point than the first molding unit. In the above module, the first molding unit has a higher thermal conductivity than the second molding unit. In the above module, the first molding unit is nonflammable. In the above module, the second molding unit and the first molding unit have different chemical or physical reactivities. In the above module, the first molding unit is a single molding unit, and wherein the electrical devices are disposed adjacent to each other on the substrate so that the single first molding unit covers all of the electrical devices.

In the above module, the second molding unit is a single molding unit, and wherein the single second molding unit covers the entire inspection unit. In the above module, the first molding unit and the second molding unit have different surface colors. In the above module, a mark is put on an area of the second molding unit corresponding to the second ends of the test wires. In the above module, the inspection unit is disposed on an edge of the substrate. In the above module, the inspection unit further comprises an inspection unit connector so as to be electrically connected to external devices.

In the above module, the inspection unit is disposed on an area of the substrate that is opposite to an area of the substrate on which a current input/output unit of the electronic circuit module is disposed. In the above module, the electronic circuit module is electrically connected to a secondary battery that comprises an anode, a cathode, and a separator, so as to protect the secondary battery. In the above module, the secondary battery is used for electric bicycles.

Another aspect is an electronic circuit module comprising: a substrate; at least one circuit formed on the substrate; a plurality of electrical devices electrically connected to the circuit; a first coating unit formed on at least the electrical devices; a test terminal configured to inspect the circuit, wherein the test terminal comprises a plurality of test wires each of which comprises i) a first end electrically connected to the circuit, ii) a second end and iii) an intermediate portion interconnecting the first and second ends, wherein the first end and intermediate portion are covered by the first molding unit, and wherein the second end is not covered by the first coating unit; and a second coating unit formed on the second ends of the test wires.

In the above module, the electronic circuit module is electrically connected to one of a secondary battery, a battery management system, an electric bicycle, an electric scooter and an electric automobile. in the above module, the first coating unit is significantly greater in area than the second coating unit. in the above module, the second ends of the test wires are adjacent to each other and located on an edge of the substrate.

Another aspect is a method of manufacturing an electronic circuit module, the method comprising: forming at least one circuit on a substrate, wherein the substrate comprises a first region and a second region which is smaller than the first region; forming a plurality of electrical devices on the first region such that the electrical devices are electrically connected to the circuit; providing a plurality of test wires each of which comprises i) a first end electrically connected to the circuit, ii) a second end and iii) an intermediate portion interconnecting the first and second ends; coating the first region so as to cover i) the electrical devices and ii) the first ends and intermediate portions of the test wires and so as not to cover the second ends of the test wires; and coating the second region to cover the second ends of the test wires.

The above method further comprises performing circuit inspection, for the electronic circuit module, before the coating of the second region.

BRIEF DESCRIPTION OF THE DRAWINGS

FIG. 2A is a schematic plan view of an electronic circuit module obtained by coating an electronic circuit formed according to another embodiment of the present invention with a first molding unit.

FIG. 2B is a schematic plan view of an electronic circuit module obtained by coating the electronic circuit module illustrated in FIG. 2A with a second molding unit.

DETAILED DESCRIPTION OF CERTAIN INVENTIVE EMBODIMENTS

Figure 1A:
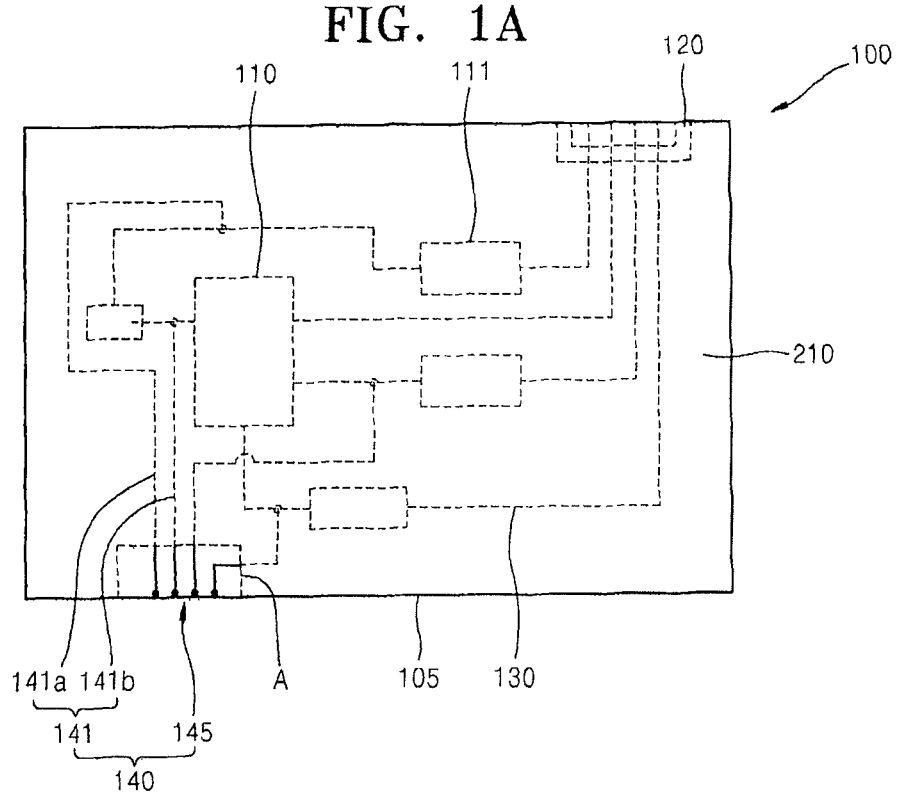
FIG. 1A is a schematic plan view of an electronic circuit module obtained by coating an electronic circuit formed according to an embodiment of the present invention with a first molding unit.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein.

Generally, a circuit formed on a substrate may be coated with a molding material, for example, in order to waterproof the circuit. If a substrate coated with a molding material has circuit connection problems, it is not easy to check whether the circuit is functioning properly. In order to determine whether a circuit between electronic devices on a substrate has been properly formed, molding material covering the circuit may be melted using chemicals to allow for inspection of the circuit. However, the chemicals may melt not only the molding material but also the substrate. Removal of all molding material around the electronic devices is inefficient in terms of time and costs. Even if a circuit has no problems prior to molding, the circuit may be damaged during molding. Thus, normality or abnormality of the circuit needs to be checked after the circuit has been molded.

Figure 1B:
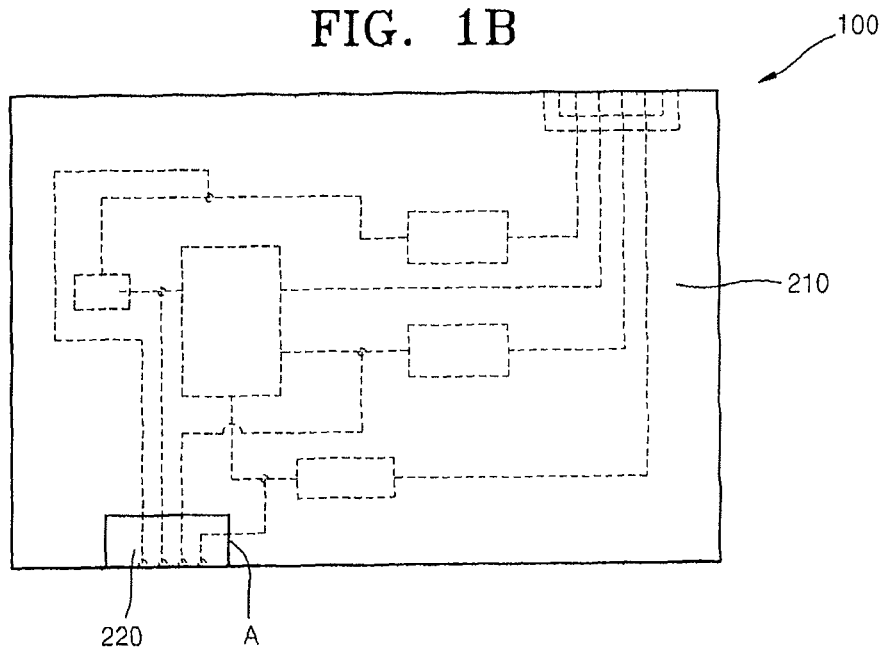
FIG. 1B is a schematic plan view of an electronic circuit module obtained by coating the electronic circuit module illustrated in FIG. 1A with a second molding unit.

One embodiment is an electronic circuit module having a circuit on a substrate, wherein the circuit may be checked for abnormalities without having to melt all molding material coated on the substrate, which will be described with reference to FIGS. 1A and 1B. FIG. 1A is a schematic plan view of an electronic circuit module 100 obtained by coating an electronic circuit formed according to an embodiment of the present invention with a first molding unit (interchangeably used with first coating unit or first region) 210. FIG. 1B is a schematic plan view of the electronic circuit module 100 of FIG. 1A coated with a second molding unit 220 (interchangeably used with second coating unit or second region). The electronic circuit module 100 illustrated in FIG. 1A is merely exemplary, and thus the structure of the electronic circuit module 100 illustrated in FIG. 1A may be different from that of an actual electronic circuit module.

The electronic circuit module 100 includes a substrate 105, electric devices (or electrical devices) 110 and 111, a test terminal unit 140, the first molding unit 210, and the second molding unit 220.

A circuit is formed on the substrate 105. The electric devices 110 and 111 are electronic components disposed on the substrate 105 and may be respectively, for example, an integrated circuit (IC) 110 and a field-effect transistor (FET) 111. The electric devices 110 and 111 are electrically connected to each other by circuit wiring 130. The first molding unit 210 is coated on the substrate 105 to cover the electric devices 110 and 111. The first molding unit 210 may cover more than the electric devices 110 and 111. According to the locations of the electric devices 110 and 111, the first molding unit 210 may be molding units molded on the electric devices 110 and 111, respectively and separately, or a single molding unit that may cover both the electric devices 110 and 111. The electric devices 110 and 111 may be connected to an output connector 120 so as to be able to transmit and receive an electrical signal to and from the outside. The output connector 120 is electrically connected to the outside and may be used to check operation states of the electric devices 110 and 111 and circuit connections states. Although the electric devices 110 and 111 and/or circuit connection states can be checked exclusively through the output connector 120, it is not easy to check wiring between the electric devices 110 and 111 or specific spots on the circuit not connected to the outside.

The test terminal unit 140 includes a plurality of test wires 141. For convenience of explanation, the test wires 141 of the test terminal unit 140 are indicated by reference numerals 141a and 141b hereinafter, but the present invention is not limited thereto. The number and configuration of test wires of the test terminal unit 140 may vary. First ends of the test wires 141a and 141b are disposed on and electrically connected to parts of the circuit to be inspected. Since the first ends of the test wires 141a and 141b are connected to the parts of the circuit to be inspected, inspection equipment is connected to second ends of the test wires 141a and 141b, whereby a connection state of the parts of the circuit to be inspected can be checked. Each of the test wires 141 may further include an intermediate portion interconnecting the first ends and second ends. The second ends of the test wires 141a and 141b may be scatteredly arranged on the substrate 105. However, if the second ends of the test wires 141a and 141b are substantially spaced apart from each other on the substrate 105, each second end of the test wires 141a and 141b are to be individually and manually inspected and thus efficiency is low. Thus, the second ends of the test wires 141a and 141b may be arranged collectively at one place. If the second ends of the test wires 141a and 141b are located at one place, all the test wires 141a and 141b may be inspected at once using a machine or the like without the need of individual and manual checking. Referring to FIG. 1A, an inspection unit 145 of the test terminal unit 140 is a spot where the second ends of the test wires 141a and 141b are collectively disposed on the substrate 105 so as to allow for easy inspection. The inspection unit 145 may be disposed on any area of the substrate 105 such as, for example, on an edge area of the substrate 105 so as to allow for easy inspection.

In addition, the inspection unit 145 of the test terminal unit 140 may be disposed on an area of the substrate 105 that is opposite to an area where a current input/output unit of the electronic circuit module 100 is disposed. For example, if the electronic circuit module 100 is applied to a battery management system (BMS) connected to a secondary battery of an electric bicycle, the inspection unit 145 may be disposed on a side opposite to a side where a current input/output unit, in which large current flows due to electrical connection of the current input/output unit to the secondary battery, is disposed. By disposing the inspection unit 145 on a side opposite to a side where a current input/output unit is disposed, as described above, interference due to flowing of large current in the current input/output unit that may affect inspection performed in the inspection unit 145 may be reduced.

Referring to FIGS. 2A and 2B, the inspection unit 145 of the test terminal unit 140 may further include an inspection unit connector 150. FIG. 2A is a schematic plan view of an electronic circuit module 100 obtained by coating an electronic circuit formed according to another embodiment of the present invention with the first molding unit 210. FIG. 2B is a schematic plan view of the electronic circuit module 100 of FIG. 2a coated with the second molding unit 220. As illustrate in FIG. 2A, since the inspection unit 145 includes the inspection unit connector 150, the circuit may be easily inspected through a connector connection. In other words, during circuit inspection, a user does not need to individually inspect the second ends of the test wires 141a and 141b one by one. Instead, an apparatus for determining normality or abnormality of a circuit may be electrically connected to the inspection unit connector 150 to allow for inspection of the second ends of the test wires 141a and 141b at a time. This allows for quick and easy inspection of the circuit by skipping unnecessary processes. The inspection unit connector 150 may be a jack connector. After inspection using the inspection unit connector 150, only the inspection unit connector 150 may be removed, and then the second molding unit 220 may be coated on the electronic circuit module 100. Alternatively, without removing the inspection unit connector 150, the second molding unit 220 may be coated on the inspection unit connector 150.

As shown in FIGS. 1B and 2B, an area A that surrounds the inspection unit 145 may be coated with the second molding unit 220. In one embodiment, the first molding unit 210 covers the electric devices 110 and 111 and the second molding unit 220 covers areas other than the areas corresponding to the electric devices 110 and 111. This may provide advantages over the method of entirely covering the substrate 105 with a single molding unit. For example, if a circuit is coated with a molding unit, it needs to be determined whether the circuit has been damaged by molding or if the circuit has been formed properly after a molding unit is coated on the circuit. However, to determine this, the molding unit needs to be removed, which may be problematic. However, the two moldings 210 and 220 rather than a single molding are coated on different areas of the substrate 105. Thus, circuit inspection may be performed without removing both the molding units 210 and 220.

Figure 3:
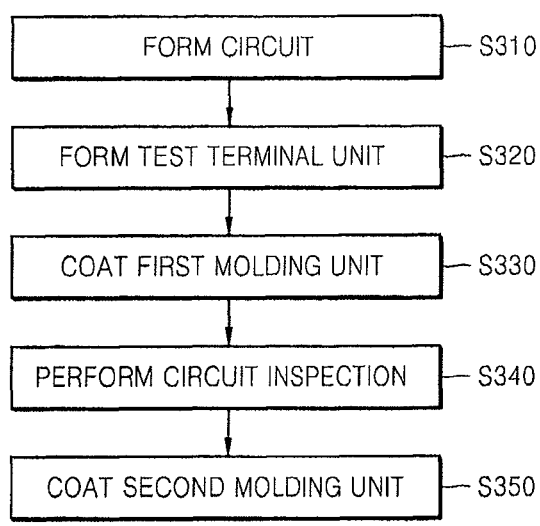
FIG. 3 is a flowchart of a method of manufacturing an electronic circuit module, according to an embodiment of the present invention.

FIG. 3 is a flowchart of a method of manufacturing the electronic circuit module 100, according to an embodiment of the present invention. In one embodiment, the electronic circuit module 100 is manufactured as follows. Depending on the embodiment, additional operations may be added, others removed, or the order of the operations may change in FIG. 3. Referring to FIG. 3, the circuit including the plurality of electric devices 110 and 111 is formed on the substrate 105, in operation S310. In operation S320, the test terminal unit 140 is formed on the substrate 105. The test terminal unit 140 includes the plurality of test wires 141 of which the first ends thereof are electrically connected to the circuit so as to allow for inspection of the circuit. In operation S320, the second ends of the test wires 141 may be disposed collectively at one place. In operation S330, the substrate 105 is coated with the first molding unit 210 to cover the electric devices 110 and 111. However, the first molding unit 210 may not cover the collectively disposed second ends of the test wires 141. If the substrate 105 is coated in this way, the first molding unit 210 is coated, and the second molding unit 220 is not yet coated. Thus, in operation S340, the second ends of the test wires 141 located at the area of the second molding unit 220 may be connected to the outside, thus allowing for circuit inspection to be performed. According to this method, the circuit formed on the substrate 105 may be inspected without removing the first molding unit 210, that is, without removing molding units formed on the electric devices 110 and 111. Thus, in operation S350, after it is checked if the circuit has been damaged during molding, the second molding unit 220 may be coated (See FIGS. 1B and 2B). When the second molding unit 220 is coated on the substrate 105, if the inspection unit 145 is connected to the inspection unit connector 150, the inspection unit connector 150 may be coated with the second molding unit 220.

This manufacturing method is advantageous in forming circuits that are usually to be waterproofed, such as a BMS of an electric bicycle. Electric bicycles are often exposed to water and thus their circuits have a high probability of contacting water, as in the cases where they are placed outdoors, used in the rain, or used around water. Thus, waterproof circuits are usually used in electric bicycles. Accordingly, in manufacturing a waterproof circuit, normality or abnormality of the circuit needs to be checked after the circuit is coated and additional coating is needed to waterproof a part of the circuit exposed to allow for checking of the circuit. In this case, the method according to the present embodiment may be more securely waterproofed because there is no process of removing a molding unit and even an inspection unit may be coated with molding.

Figure 4:
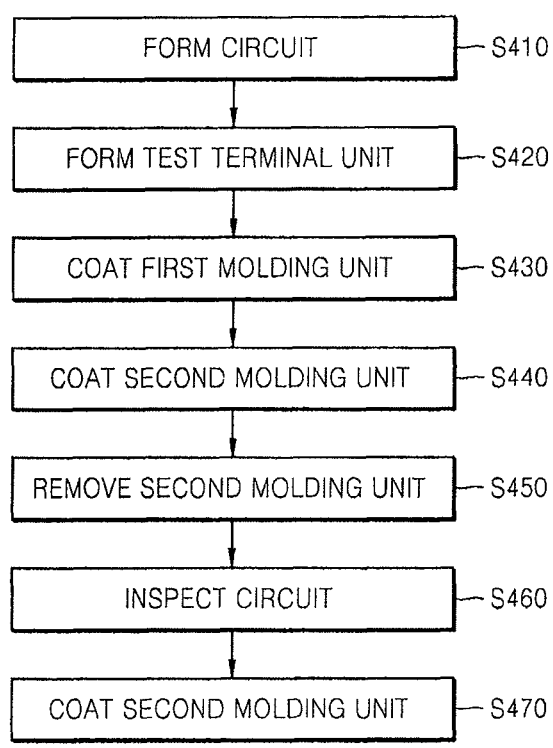
FIG. 4 is a flowchart of a method of manufacturing an electronic circuit module, according to another embodiment of the present invention.

While manufacturing the electronic circuit module, the circuit may be inspected using other methods. For example, FIG. 4 illustrates a flowchart of a method of manufacturing the electronic circuit module 100, according to another embodiment of the present invention. In one embodiment, the electronic circuit module 100 is manufactured as follows. Depending on the embodiment, additional operations may be added, others removed, or the order of the operations may change in FIG. 4. Referring to FIG. 4, in operation S410, the circuit including the electric devices 110 and 111 is formed on the substrate 105. In operation S420, the test terminal unit 140 is formed on the substrate 105. Thereafter, in operations S430 and S440, the substrate 105 is covered with the first molding unit 210 and the second molding unit 220, respectively. The first molding unit 210 and the second molding unit 220 may be coated in the order stated or in an inverse order. Alternatively, after the first molding unit 210 is coated on the substrate 105 and then undergoes a circuit inspection, the second molding unit 220 may be coated on the substrate 105. In operation S450, if a circuit inspection is to be performed, for example, such as when the circuit is being used, after the first molding unit 210 and the second molding unit 220 are coated on the substrate 105, the second molding unit 220 may be removed. The second ends of the test wires 141 may be exposed by removing the second molding unit 220 as described above, and then the circuit may be inspected, in operation S460. In operation S470, after normality or abnormality of the circuit is checked, the second molding unit 220 may be coated again to cover the exposed portions of the test wires 141. Various methods of removing the inspection unit 145 or the inspection unit connector 150 under the second molding unit 220 will now be described.

In an example of forming the first molding unit 210 and the second molding unit 220, the second molding unit 220 may be formed to have a melting point lower than that of the first molding unit 210. Even after the substrate 105 is covered by the first molding unit 210 and the second molding unit 220, normality or abnormality of the circuit may be checked in some cases. If the second molding unit 220 has a melting point lower than that of the first molding unit 210, only the second molding unit 220 may be melted without needing to remove all molding units, by being heated at a temperature that is higher than the melting point of the second molding unit 220 and lower than that of the first molding unit 210. As described above, even when melting only the second molding unit 220, the second ends of the test wires 141 may be exposed and thus a circuit inspection may be performed. In this way, the circuit inspection of the substrate 105 may be performed.

Alternatively, the second molding unit 220 and the first molding unit 210 may be constructed to have different reactivities. For example, if a specific material that reacts strongly with the second molding unit 220 but not with the first molding unit 210 is applied to the second molding unit 220, the first molding unit 210 is not deformed due to its weak reactivity and only the second molding unit 220 may be melted, and thus a circuit inspection of the substrate 105 is possible.

Different ways of forming the first molding unit 210 and the second molding unit 220 may realize different effects. For example, the first molding unit 210 may be formed of a nonflammable material. In greater detail, since the first molding unit 210 covers the electric devices 110 and 111, the first molding unit 210 may be melted or burnt when the electric devices 110 and 111 emit light or in other cases. Accordingly, the first molding unit 210 covering the electric devices 110 and 111 may be formed of a nonflammable material to improve the stability of the electronic circuit module 100.

The first molding unit 210 and the second molding unit 220 may be formed to have different surface colors. By differentiating the surface colors of molding units as described above, a user may easily identify the location of the inspection unit 145 even after coating.

In addition, the first molding unit 210 and the second molding unit 220 may provide waterproofing. If the first and second molding units 210 and 220 have waterproof functions as described above, the stability of the electronic circuit module 100 may be maintained even when the electronic circuit module 100 is exposed to the outside or contacts water.

Figure 5A:
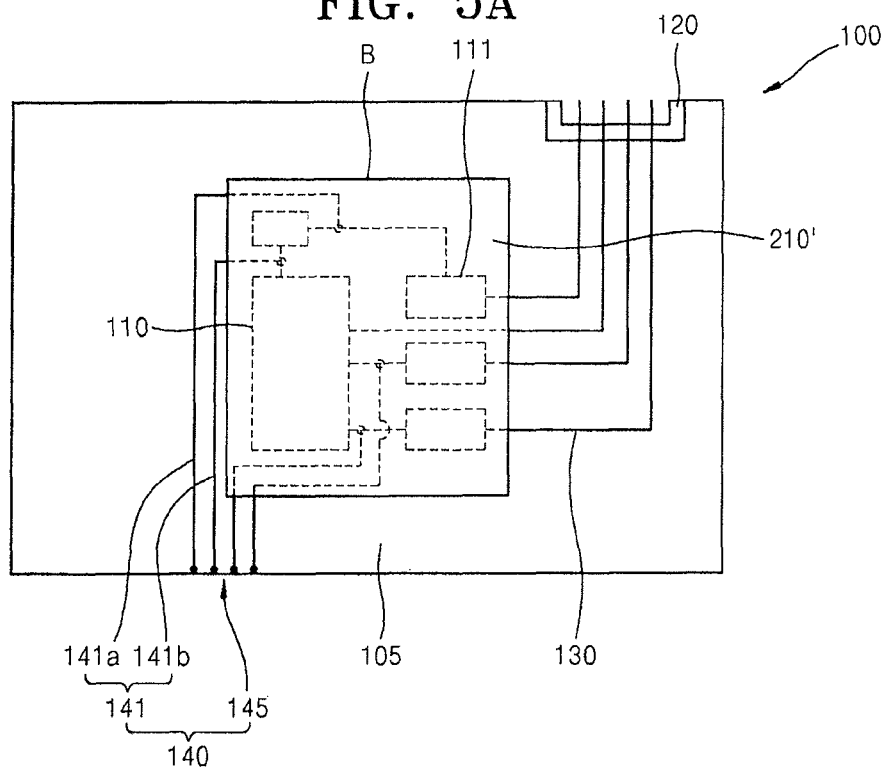
FIG. 5A is a schematic plan view of an electronic circuit module obtained by coating an electronic circuit formed according to another embodiment of the present invention with a first molding unit.
Figure 5B:
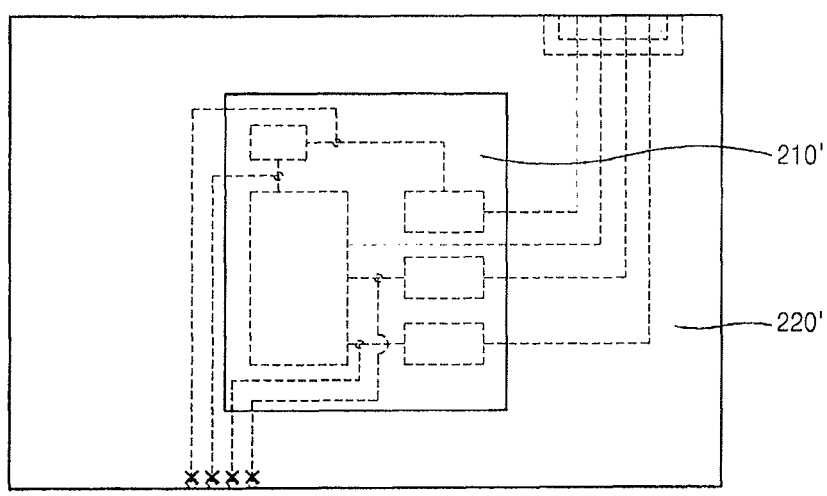
FIG. 5B is a schematic plan view of an electronic circuit module obtained by coating the electronic circuit module illustrated in FIG. 5A with a second molding unit.
Figure 5C:
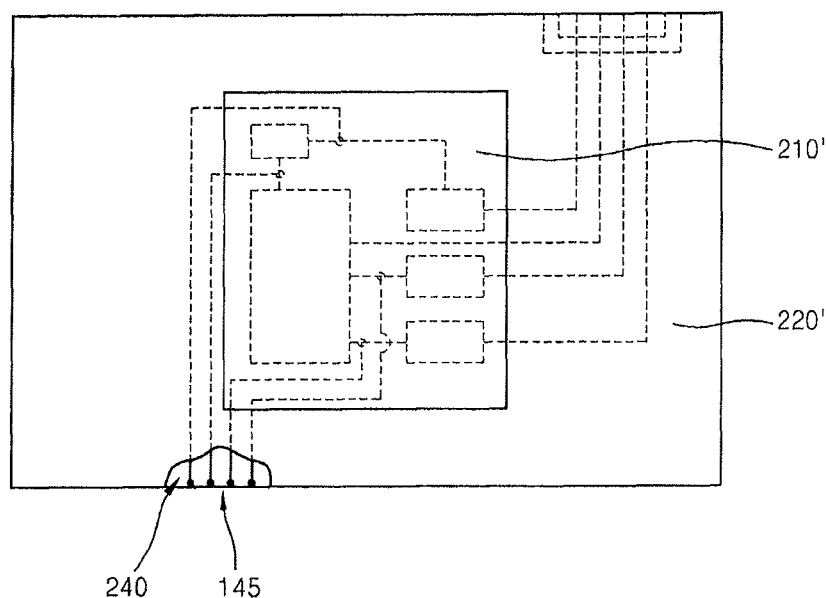
FIG. 5C is a schematic plan view of an electronic circuit module obtained by removing a part of the second molding unit corresponding to an inspection unit from the electronic circuit module illustrated in FIG. 5B.

In another example of forming the first molding unit 210 and the second molding unit 220, the first molding unit 210 may be formed to have a thermal conductivity greater than that of the second molding unit 220. The first molding unit 210 covers the electric devices 110 and 111, and the electric devices 110 and 111 may include components whose temperatures increase according to charging and discharging of the electronic circuit module, for example, the IC 110, the FET 111, and a current sensing register (not shown). If the components whose temperatures increase according to operations of the electronic circuit modules are covered with a molding material, the performance of the operations may be degraded because the rate of heat transfer is reduced. To address this problem, the first molding unit 210 covering the electric devices 110 and 111 may include a member having higher thermal conductivity than the second molding unit 220 and thus have waterproof and heat-prevention functions. Since a molding material having waterproof and heat-prevention functions is more expensive than a molding material having only a waterproof function, the second molding unit 220 may include a molding material having only a waterproof function. The first molding units 210 having waterproof and heat-prevention functions may be disposed a considerable distance from each other on the substrate 105 according to the locations of the electric devices 110 and 111 on the substrate 105. However, instead of coating first molding units 210' on the substrate 105 a considerable distance from each other, the electric devices 110 and 111 may be covered via one molding operation by being disposed at one place on the substrate 105. Another embodiment of the present invention where the electric devices 110 and 111 are collectively disposed on the substrate 105 so that a single first molding unit 210' covers both the electric devices 110 and 111 will now be described with reference to FIGS. 5A, 5B, and 5C. FIG. 5A is a schematic plan view of an electronic circuit module 100 obtained by coating an electronic circuit formed according to another embodiment of the present invention with a first molding unit 210'. FIG. 5B is a schematic plan view of an electronic circuit module obtained by coating the electronic circuit module 100 illustrated in FIG. 5A with a second molding unit 220'. FIG. 5C is a schematic plan view of an electronic circuit module obtained by removing a part of the second molding unit 220' corresponding to the inspection unit 145 from the electronic circuit module illustrated in FIG. 5B.

Referring to FIGS. 5A and 5B, the single first molding unit 210' may cover both the electric devices 110 and 111 by installing the electric devices 110 and 111 at one place on the substrate 105. By disposing the electric devices 110 and 111 collectively on the substrate 105 and covering the electric devices 110 and 111 with a molding material having waterproof and heat-prevention functions as described above, an area covered with the molding material having waterproof and heat-prevention functions may be reduced and thus the method is advantageous in terms of costs. In addition, both the electric devices 110 and 111 may be covered by one molding operation without needing to performing several molding operations on different areas of the substrate 105, and thus the method is advantageous in terms of process. By covering the electric devices 110 and 111 with a molding material and disposing the second ends of test wires 141a and 141b corresponding to the area of a second molding unit 220' and using the molding material having waterproof and heat-prevention functions, a circuit inspection may be easily performed after molding. An area of the substrate 105 other than the area of the first molding unit 210' may be covered with the second molding unit 220'. Referring to FIG. 5B, the area covered with the second molding unit 220' may be an area where the second ends of the test wires 141a and 141b are disposed, that includes the inspection unit 145 and that is wider than the inspection unit 145. The inspection unit 145 may be marked as indicated by a reference numeral 240 on a surface of the second molding unit 220' that corresponds to the inspection unit 145, which corresponds to the second ends of the test wires 141a and 141b. Accordingly, if circuit inspection is needed after the second molding unit 220' is coated on the substrate 105, the circuit inspection may be performed by melting or removing the second molding unit 220' along the mark 240. Referring to FIG. 5C, the entire second molding unit 220' is not needed to be removed, and a part of the second molding unit 220' may be removed and thus only the inspection unit 145 under the second molding unit 220' within the mark 240 is exposed. By removing a part of the second molding unit 220' as described above, an area covered by the first molding unit 210' having waterproof and heat-prevention functions, which is relatively expensive, may be minimized, and circuit inspection may be achieved while only the inspection unit 145 is exposed.

Figure 6:
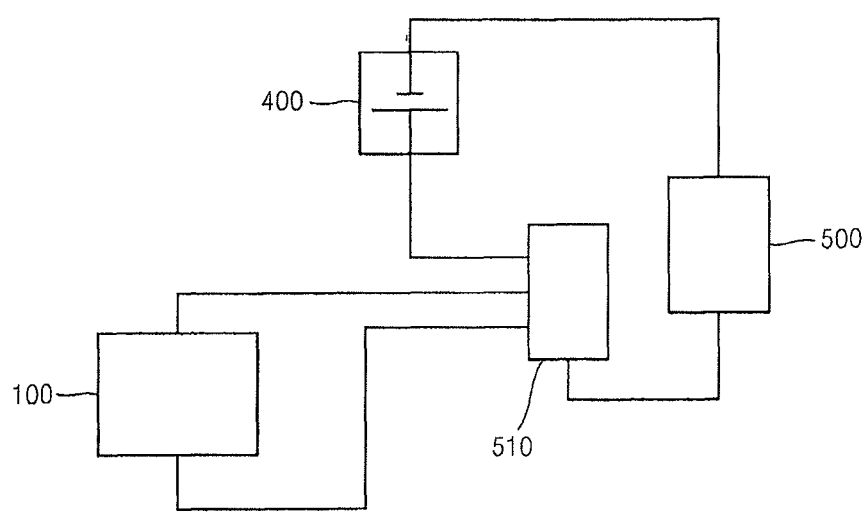
FIG. 6 is a schematic cross-sectional view illustrating application of an electronic circuit module according to the present invention to a secondary battery.

The electronic circuit module 100 constructed as described above may be electrically connected to a secondary battery 400 so as to protect the secondary battery 400. In this case, the secondary battery 400 may include an electrode assembly that includes an anode, a cathode, and a separator. For example, FIG. 6 is a schematic cross-sectional view illustrating application of the electronic circuit module 100 to the secondary battery 400. In FIG. 6, the electronic circuit module 100 may be connected to a power on/off unit 510, and the power on/off unit 510 may be connected to the secondary battery 400 and an external input/output circuit 500. For example, the electronic circuit module 100 may be applied to a BMS. The electronic circuit module 100 applied to the secondary battery 400 as described above may also be applied to electric driving apparatuses such as electric bicycles, electric scooters, and electric automobiles. The electronic circuit module 100 may also be applied to battery packs of the secondary battery 400. As described above, due to an application of the electronic circuit module 100, a circuit applied to secondary batteries, battery management systems, electric bicycles, electric scooters, electric automobiles, etc., may be covered with a molding unit and then may be inspected while the molding unit is not removed. In addition, the circuit may maintain waterproof performance according to a molding method according to an embodiment of the present invention.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A system comprising:
an electronic circuit module operatively connected to a secondary battery that comprises an anode, a cathode, and a separator, so as to protect the secondary battery, wherein the electronic circuit module comprises:
a substrate on which a circuit is formed;
an electrical device electrically connected to the circuit;
a first molding unit coated on the substrate to cover the electrical device;
a test terminal unit comprising a test wire and configured to inspect the circuit, wherein the test wire comprises a first end electrically connected to the circuit and a second end configured to form an inspection unit, and wherein the inspection unit is disposed on an edge of the substrate; and
a second molding unit coated on the substrate to cover the second end of the test wire.

2. The system of claim 1, wherein the second molding unit and the first molding unit have different chemical or physical reactivities.

3. The system of claim 1, wherein the first molding unit is a single molding unit.

4. The system of claim 1, wherein the second molding unit is a single molding unit and covers the inspection unit.

5. The system of claim 1, wherein a mark is put on an area of the second molding unit corresponding to the second end of the test wire.

6. The system of claim 1, wherein the inspection unit comprises an inspection unit connector so as to be electrically connected to an external device.

7. The system of claim 1, wherein the inspection unit is disposed on an area of the substrate that is opposite to an area of the substrate on which a current input/output unit of the electronic circuit module is disposed.

8. The system of claim 1, wherein the first molding unit is greater in area than the inspection unit.

9. An electronic circuit module comprising:
a substrate;
a circuit formed on the substrate;
an electrical device electrically connected to the circuit;
a nonflammable first coating unit covering the electrical device;
a test terminal configured to inspect the circuit, wherein the test terminal comprises a test wire comprising i) a first end electrically connected to the circuit and ii) a second end configured to form an inspection unit, wherein the inspection unit comprises an inspection unit connector so as to be electrically connected to an external device; and a second coating unit covering the second end of the test wire.

10. An electronic circuit module comprising:
a substrate;
a circuit formed on the substrate;
an electrical device electrically connected to the circuit;
a nonflammable first coating unit covering the electrical device;
a test terminal configured to inspect the circuit, wherein the test terminal comprises a test wire comprising i) a first end electrically connected to the circuit and ii) a second end configured to form an inspection unit, and wherein the inspection unit comprises an inspection unit connector so as to be electrically connected to an external device; and
a second coating unit covering the second end of the test wire,
wherein the inspection unit is disposed on an edge of the substrate.

11. The electronic circuit module of claim 9, wherein the first coating unit is greater in area than the inspection unit.

12. An electronic circuit module comprising:
a circuit formed on a substrate;
a first coating unit coated on the substrate to cover the circuit;
a test terminal unit comprising a test wire and configured to inspect the circuit, wherein the test wire comprises a first end electrically connected to the circuit and a second end configured to form an inspection unit, and wherein the inspection unit is disposed on an edge of the substrate; and
a second coating unit coated on the substrate to cover the second end of the test wire.

13. The electronic circuit module of claim 12, further comprising at least one electrical device formed on the substrate and operatively connected to the circuit.

14. The electronic circuit module of claim 13, wherein the first coating unit covers the at least one electrical device.

15. The electronic circuit module of claim 12, wherein the first coating unit is substantially greater in area than the inspection unit.

16. The electronic circuit module of claim 12, wherein the first coating unit is substantially greater in area than the second coating unit.

17. The electronic circuit module of claim 12, wherein the second coating unit has a lower melting point than the first coating unit.

18. The electronic circuit module of claim 12, wherein the first coating unit has a higher thermal conductivity than the second coating unit.

19. The electronic circuit module of claim 12, wherein the first coating unit and the second coating unit have different surface colors.

20. The electronic circuit module of claim 12, wherein the electronic circuit module is electrically connected to a secondary battery that comprises an anode, a cathode, and a separator, so as to protect the secondary battery.

* * * * *